United States Patent
Hsu et al.

(10) Patent No.: US 9,530,487 B2
(45) Date of Patent: Dec. 27, 2016

(54) METHOD OF WRITING MEMORY WITH REGULATED GROUND NODES

(71) Applicant: TAIWAN SEMICONDUCTOR MANUFACTURING COMPANY, LTD., Hsinchu (TW)

(72) Inventors: Kuoyuan (Peter) Hsu, San Jose, CA (US); Yukit Tang, Sunnyvale, CA (US); Derek Tao, Fremont, CA (US); Young Seog Kim, Pleasanton, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/972,908

(22) Filed: Dec. 17, 2015

(65) Prior Publication Data

US 2016/0104525 A1    Apr. 14, 2016

Related U.S. Application Data

(60) Continuation of application No. 14/051,682, filed on Oct. 11, 2013, now Pat. No. 9,218,857, which is a
(Continued)

(51) Int. Cl.
*G11C 11/413* (2006.01)
*G11C 11/419* (2006.01)
*G11C 7/00* (2006.01)

(52) U.S. Cl.
CPC .............. *G11C 11/419* (2013.01); *G11C 7/00* (2013.01); *G11C 11/413* (2013.01)

(58) Field of Classification Search
USPC ........................................................ 365/154
See application file for complete search history.

(56) References Cited

U.S. PATENT DOCUMENTS

| | | |
|---|---|---|
| 5,023,837 A | 6/1991 | Schreck et al. |
| 6,674,670 B2 | 1/2004 | Jeung |

(Continued)

FOREIGN PATENT DOCUMENTS

| | | |
|---|---|---|
| CN | 1574090 | 2/2005 |
| CN | 101727954 | 6/2010 |

(Continued)

OTHER PUBLICATIONS

Office Action dated Jul. 26, 2012 with English Translation from corresponding No. KR 10-2011-0007421.

(Continued)

*Primary Examiner* — Min Huang
(74) *Attorney, Agent, or Firm* — Hauptman Ham, LLP

(57) ABSTRACT

A method of writing data to an accessed memory cell of an accessed column of an accessed section of a memory array includes, electrically coupling a first voltage source of at least three voltage sources to a column internal ground node of the accessed column; and electrically coupling the first voltage source of the at least three voltage sources to a column internal ground node of an un-accessed column of an un-accessed segment. The memory array has at least one segment. Each memory cell has an internal ground node. The at least one segment has at least one section, and each section has at least one column and at least one row. Each column has at least three switches and a column internal ground node capable of being electrically coupled to at least three voltage sources through a corresponding one of the at least three switches.

20 Claims, 5 Drawing Sheets

Related U.S. Application Data division of application No. 12/832,320, filed on Jul. 8, 2010, now Pat. No. 8,576,611.

(56) References Cited

U.S. PATENT DOCUMENTS

| | | | |
|---|---|---|---|
| 7,903,470 B2 | 3/2011 | Tseng et al. | |
| 8,576,611 B2* | 11/2013 | Hsu | G11C 11/413 365/154 |
| 9,218,857 B2* | 12/2015 | Hsu | G11C 11/413 |
| 2007/0217262 A1* | 9/2007 | Sachdev | G11C 8/10 365/185.16 |
| 2008/0158939 A1 | 7/2008 | Chen et al. | |
| 2008/0316837 A1* | 12/2008 | Nii | G11C 5/14 365/189.07 |
| 2009/0109733 A1* | 4/2009 | Wong | G11C 11/413 365/154 |
| 2010/0103759 A1* | 4/2010 | Ouyang | G11C 5/147 365/226 |
| 2010/0238753 A1 | 9/2010 | Chen et al. | |
| 2011/0280094 A1* | 11/2011 | Heymann | G11C 11/413 365/226 |

FOREIGN PATENT DOCUMENTS

| | | |
|---|---|---|
| JP | 2009-151920 | 7/2009 |
| KR | 1998-071029 | 10/1998 |
| KR | 0179361 | 4/1999 |
| KR | 2002-0085897 | 11/2002 |

OTHER PUBLICATIONS

Notice of Allowance dated Jan. 29, 2013 with English Translation from corresponding No. KR 10-2011-0007421.
Office Action dated Apr. 28, 2013 from corresponding application No. CN 201110187880.4.
Office Action dated Nov. 12, 2014 from corresponding No. TW 100124182.
Office Action dated Oct. 30, 2013 from corresponding application No. CN 201110187880.4.

* cited by examiner

US 9,530,487 B2

1

METHOD OF WRITING MEMORY WITH REGULATED GROUND NODES

PRIORITY CLAIM

The present application is a continuation of U.S. application Ser. No. 14/051,682, filed Oct. 11, 2013, now U.S. Pat. No. 9,218,857, which is a divisional of U.S. application Ser. No. 12/832,320, filed Jul. 8, 2010, now U.S. Pat. No. 8,576,611, issued Nov. 5, 2011, the disclosures of which are incorporated herein by reference in their entireties.

FIELD

The present disclosure is generally related to a memory, and more particularly related to a memory having regulated ground nodes.

BACKGROUND

In advanced technologies (e.g., 0.13 μm process and below), noise can greatly affect the write voltage trip point (e.g., the voltage on a bit line sufficient to write data to a node) of a static random access memory (SRAM), specifically in lower operation voltages (e.g., lower voltage VCC at 0.65 V versus nominal voltage VCC at 0.85 V). The noise limits the range of the SRAM operation voltage and increases power consumption because the SRAM needs to use a higher supply voltage VCC. To improve the situation, in one approach, a bit line having a negative voltage is used in a write operation. This approach, however, has various drawbacks. For example, a voltage pump circuit is required to provide the negative voltage. The voltage pump mechanism is usually not power efficient. Controlling the voltage level of a negative voltage is not easy. A potential risk exists because of the forward bias that can cause a current leak from the bit line to the substrate of the transistors in the memory, which requires a careful handling and causes difficulty in using the SRAM in a compiler.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
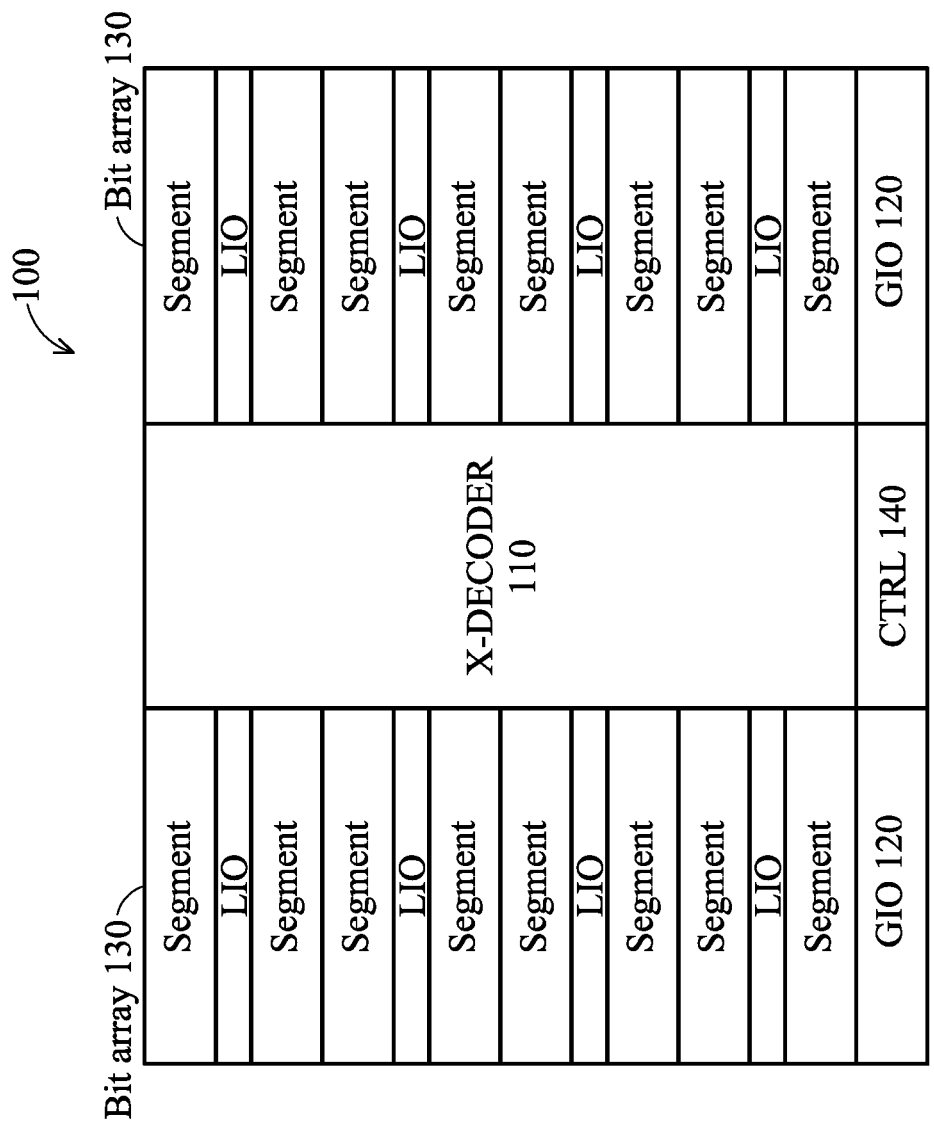
FIG. 1 is a block diagram of a memory in accordance with some embodiments.

Embodiments, or examples, illustrated in the drawings are disclosed using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number. Based on the regulated ground nodes, some embodiments provide a higher range of operation voltage for an SRAM.

Exemplary Memory

FIG. 1 is a block diagram of a memory 100 in accordance with some embodiments. Memory 100 includes two bit arrays (e.g., memory arrays) 130. Each bit array 130 includes an array of memory cells MC arranged in segments (e.g., segments 135, reference numbers 135 are not shown for simplicity). Each segment 135 includes at least one row and at least one column of memory cells (e.g., memory cell MC). In some embodiments, each segment 135 includes a plurality of columns that expand across the whole horizontal width of bit array 130. Further, a row of local input/output circuits (e.g., LIOs 137, reference numbers 137 are not shown for simplicity) is sandwiched between two segments 135 (e.g., an upper segment and a lower segment) and includes circuitry for use by the respective lower and upper segments.

X-decoder 110 provides the X- or row-address of a memory cell to be accessed (e.g., the memory cell from which data is read from or written to).

Control circuit 140 provides the pre-decode, clock, y-decoder, and other signals to memory 100.

Global input/output circuits (GIOs) 120 serve as a mechanism for transferring data between the memory cells MC and other circuitries.

X-decoder 110, global GIOs 120, and control circuit 140 are commonly called peripheral circuitry.

FIG. 1 shows memory 100 for illustration, but embodiments of the disclosure are not so limited, and are usable independent of the memory architecture.

The Segment

Figure 2:
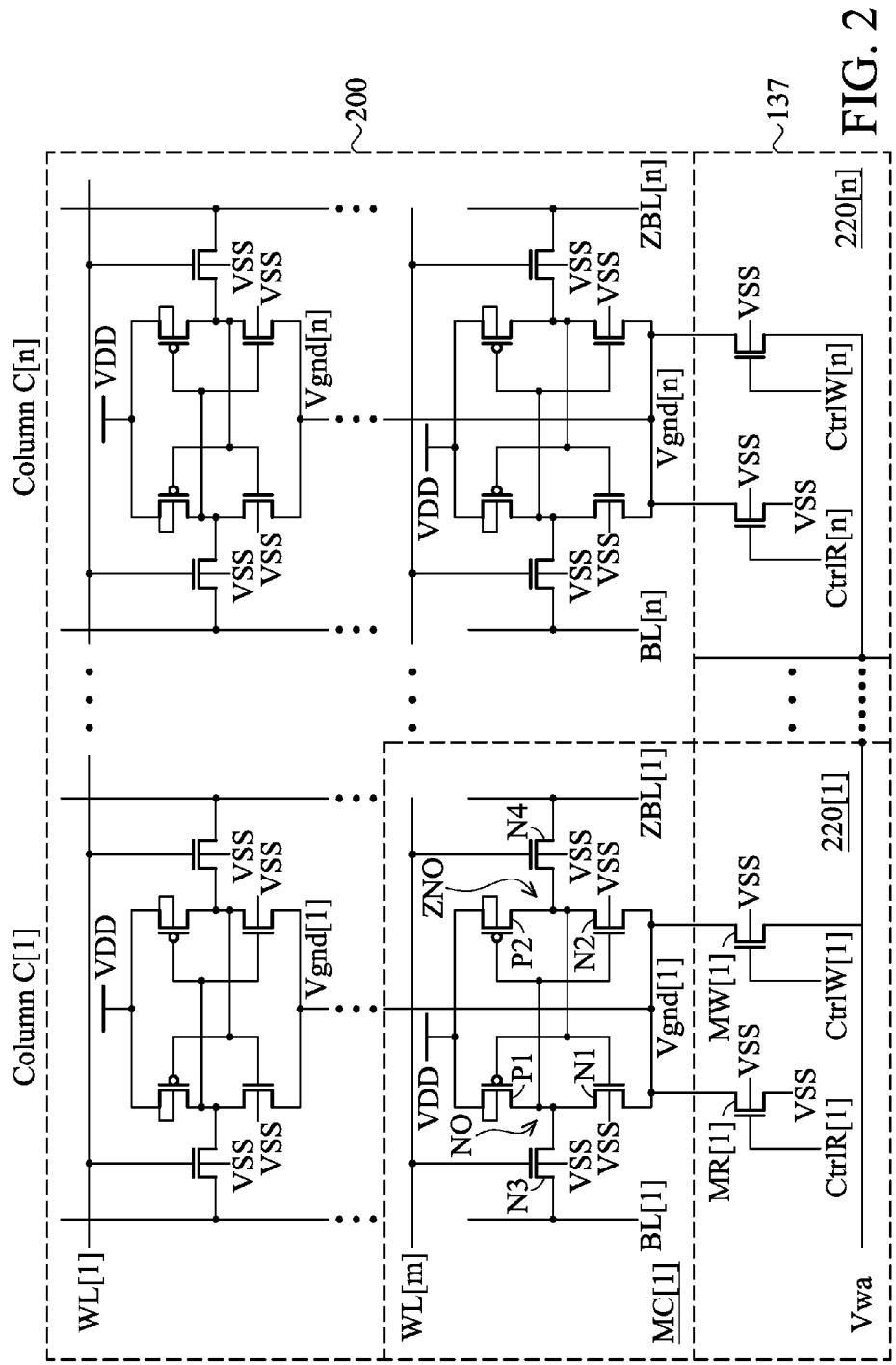
FIG. 2 is a diagram of a portion of a segment of the memory in FIG. 1, in accordance with some embodiments.

FIG. 2 is a diagram of a section 200 illustrating a portion of a segment 135, in accordance with some embodiments. Section 200 includes m number of rows where m is a number greater than 0. Section 200 is coupled to a local IO 137. In FIG. 2, a local IO 137 is illustratively shared between n columns (e.g., column C[1] to column C[n]) of section 200, where n is a number greater than 0. Further, a segment 135 includes one or a plurality of sections 200, but for ease of understanding and simplicity of illustration, only one section 200 is shown. In some embodiments, all nodes VDD in memory 100 are coupled together. A word line WL (e.g., WL[1]) controls memory cells in a row (e.g., row 1) of a segment 135.

A column of memory cells MC (e.g., column C[1]) is coupled to a pair of bit lines BL and BLB (e.g., a bit line BL[1] and a bit line ZBL[1]). Each memory cell MC in memory 100 includes similar components. For simplicity, only details of one memory cell MC in a column C[1] are labeled. Transistors P1, P2, N1, and N2 form a cross latch for a memory cell MC. Nodes NO and ZNO store data for a memory cell MC. Transistors N3 and N4 serve as a mechanism for transferring data between nodes NO and ZNO and the respective bit lines BL and ZBL (e.g., bit lines BL[1] and ZBL[1]). For example, in a read operation for one of the memory cells, such as memory cell MC[1], the data stored in nodes NO and ZNO are transferred through the respective transistors N3 and N4 to the respective bit lines BL[1] and ZBL[1], which are then processed accordingly. In a write operation, the data on lines BL[1] and ZBL[1] are transferred through the respective transistors N3 and N4 to the respective nodes NO and ZNO. Each memory cell MC includes an internal ground node Vgnd constituted by the sources of transistors N1 and N2 coupled together. In some embodiments, depending on situations, an internal ground node Vgnd is pulled to VSS through a transistor MR (e.g., transistor MR[1]) or pulled/raised to voltage Vwa through a transistor MW (e.g., transistor MW[1]). Because voltage Vwa varies and can be set to a predetermined voltage of choice, the voltage level at an internal ground node Vgnd varies or is "regulated." In some embodiments, the larger the voltage difference (e.g., Vdiff, not labeled) between voltage VDD and the internal ground node Vgnd or voltage Vwa, the more difficult the data in the memory cells are corrupted, but the higher power the memory cell consumes and/or the higher leakage current the memory cell experiences. In contrast, the smaller voltage Vdiff, the easier the data are written to the memory cell, the less power the memory cell consumes and/or the less leakage current the memory cell experiences, but the data in the memory cell, however, are subject to a higher risk of being corrupted. Depending on situations, voltage Vdiff is set to a value (e.g., Vmret) sufficient to retain the data stored in the corresponding nodes NO and ZNO. Memory cells MC in FIG. 1 are shown for illustration, embodiments of the disclosure are applicable to other memory cells having different architectures.

A local IO 137 includes a plurality of ground circuits 220 (e.g., circuits 220[1] to 220[n]) each corresponding to a column. A ground circuit 220 includes a transistor MR and a transistor MW having their drains coupled together forming a column internal ground node (e.g., node CIGD, not labeled). In some embodiments, in a column of a section 200 of a segment 135, the column internal ground node CIGD is coupled to all internal ground nodes Vgnd of all memory cells MC in that column.

In some embodiments, the transistor MR of a column serves as a first current path and/or provides a mechanism for a first ground reference for all memory cells MC in that column. For example, when transistor MR[1] is on, the corresponding column internal ground node CIGD and all internal ground nodes Vgnd[1] coupled to the column internal ground node CIGD are pulled to ground or VSS because the transistor MR[1] being on pulls the voltage level at its drain (e.g., the corresponding column internal ground node CIGD) to the voltage level at its source (e.g., ground or VSS). Further, a transistor MR is turned on in a "dummy read" operation when data are written to a memory cell in another column. In FIG. 2, the source of a transistor MR is coupled to VSS or ground for illustration. In some other embodiments, a source is coupled to a variable voltage (e.g., a voltage Vra, similar to voltage Vwa), which, depending on applications, is negative or positive.

In some embodiments, a transistor MW serves as a second current path and/or provides a mechanism for a second ground reference for all memory cells MC in the corresponding column. Further, a transistor MW is turned on when data are written to a memory cell in the corresponding column of a section 200 of a segment 135. When a transistor MW is on, the transistor MW pulls the voltage level at its drain (e.g., the column internal ground node CIGD and thus all internal ground nodes Vgnd in that column) to the level at its source, e.g., voltage Vwa. Stated another way, the column internal ground node ICGD and thus the internal ground nodes Vgnd of the corresponding memory cells MC are regulated by voltage Vwa, which, depending on applications, is negative or positive.

In some embodiments, transistors MR and MW are N-type Metal-Oxide Semiconductor (NMOS). As a result, a high voltage level (e.g., a High) of the respective voltage CtrlR and voltage CtrlW driven to the respective gates of transistors MR and MW turn transistors MR and MW on. In contrast, a low logic level (e.g., a Low) driven at their gates turn them off. In some embodiments, transistors MR and MW are sized large enough to handle current in the corresponding memory cells in a column flowing through those transistors. In some embodiments, the higher the number of memory cells in a column, the larger the transistors MR and MW are. In contrast, the smaller the number of memory cells in the column, the smaller the transistors MR and MW are. Further, transistors MR and MW are also sized to handle the speed of discharging (e.g., pulling internal column ground node ICGD and internal ground nodes Vgnd to VSS) and charging the corresponding nodes ICGD/Vgnd in a column (e.g., raising nodes ICGD/Vgnd to voltage Vwa).

In some embodiments, a signal (e.g., voltage CtrlR) controls all transistors MR in a same column number of different sections 200 of a segment 135. For example, if a segment 135 has three sections 200 (e.g., sections 200A, 200B, and 200C), and each of sections 200A, 200B, and 200C has n columns C[1] to C[n], then a first voltage CtrlR (e.g., voltage CtrlR[1]) controls all transistors MR in column C[1] of each section 200A, 200B, and 200C, a second voltage (e.g., voltage CtrlR[2]) controls all transistors MR in column C[2] of each section 200A, 200B, and 200C, a third voltage (e.g., voltage CtrlR[3]) controls all transistor MR in column C[3] of each section 200A, 200B, and 200C, etc. Similarly, a signal (e.g., voltage) CtrlW controls all transistors MW in a same column number of different sections 200 of a segment 135. In the above illustrative segment 135 having three sections 200A, 200B, and 200C, a first voltage CtrlW (e.g., voltage CtrlW[1]) controls all transistors MW in column C[1] of each section 200A, 200B, and 200C, a second voltage (e.g., voltage CtrlW[2]) controls all transistors MW in column C[2] of each section 200A, 200B, and 200C, a third voltage (e.g., voltage CtrlW[3]) controls all transistor MW in column C[3] of each section 200A, 200B, and 200C, etc.

In some embodiments, voltage Vwa is provided to the sources of all transistors MW in all columns of a segment 135. In some further embodiments, voltage Vwa is provided to the sources of all transistors MW in all columns of all segments 135 in a bit array 130. In some further embodiments, voltage Vwa is provided to the sources of all transistors MW in all columns of all segments of all bit arrays 130 of memory 100.

In some embodiments, the bulks of NMOS transistors (e.g., transistors N1, N2, N3, N4, MR, MW, etc) are connected to voltage VSS or ground while the bulks of PMOS transistors (e.g. transistors P1, P2, etc.) are coupled to voltage VDD.

Illustrative Operations

In some embodiments, memory 100 operates in four modes, including a (data) retention mode, a standby mode, a read mode, and a write mode. A retention mode indicates memory 100 receives voltage Vwa at a level sufficient for the memory cells MC to retain the data stored in nodes NO and ZNO (e.g., the voltage difference between voltage VDD and voltage Vwa is Vmret). A standby mode indicates memory 100 is not in an active mode of reading or writing, but, for example, memory 100 is getting ready for reading or writing, memory 100 is in a reduced power consumption mode, etc. In some embodiments, a standby mode is the same as a retention mode because memory 100, when not being active, is provided with the appropriate voltage Vwa sufficient to retain the stored data. For illustration, in the below discussion, unless otherwise stated, the term "standby mode" includes the standby and/or retention mode. A read mode indicates the data stored in nodes NO and ZNO is provided to other circuits while a write mode indicates the data is written to (and thus is stored in) nodes NO and ZNO. Depending on the balance between avoiding the risk of data being corrupted and the need to save power in un-accessed cells, un-accessed columns, and/or un-accessed segments, the column internal ground nodes ICGD are electrically connected to voltage VSS or voltage Vwa and/or voltage Vwa is kept at a voltage level to retain the stored data. To avoid the risk of the data in the un-accessed memory cells, un-accessed columns and/or un-accessed segments being corrupted, the corresponding internal ground nodes Vgnd are connected to voltage VSS. To save power, however, the corresponding internal ground nodes Vgnd are connected to voltage Vwa and/or the voltage level of voltage Vwa is raised.

In some embodiments, in a standby mode all transistors MR in memory 100 (e.g., all transistors MR in all segments 135 in all bit arrays 130) are turned off. All transistors MW in memory 100 are turned on. As a result, all column internal ground nodes CIGD and all internal ground nodes Vgnd in memory 100 are electrically coupled to voltage Vwa. Depending on the balance between avoiding corrupting the stored data and the need to save power, the voltage level of voltage Vwa is adjusted accordingly. In some embodiments, voltage Vwa and/or voltage VDD is adjusted sufficient to retain the stored data.

In some embodiments, when memory 100 is accessed (either for reading or writing), a plurality of memory cells MC in a row of a segment 135 is accessed (e.g., the accessed memory cells AMC). Memory cells in memory 100 other than the accessed memory cells AMC are called un-accessed memory cells UAMC. A segment 135 having an accessed memory cell AMC is called an accessed segment AS. A segment 135 having all un-accessed memory cells UAMC is called an un-accessed segment UAS. Each memory cell MC of the accessed memory cells AMC is from a column of a section 200. A column having an accessed memory cell AMC is called an accessed column AC. A column having all un-accessed memory cells UAMC is called an un-accessed column UAC. For illustration, a segment 135 includes three sections 200, e.g., sections 200A, 200B, and 200C, and each section 200A, 200B, and 200C includes n columns C[1] to C[n]. For a further example, the accessed memory cells AMC are in row R1 and in the accessed columns C[1] of each section 200A, 200B, and 200C of a segment 135. The accessed memory cells AMC, in some embodiments, include accessed memory cells AMC in row R1 and in columns C[1] of the respective sections 200A, 200B, and 200C. If the accessed columns AC are columns C[2], then the accessed memory cells AMC include the accessed memory cells AMC in row R1 and in columns C[2] of the respective sections 200A, 200B, and 200C. If the accessed columns AC are columns C[3], then the accessed memory cells AMC include the accessed memory cells AMC in row R1 and in columns C[3] of the respective sections 200A, 200B, and 200C, etc. A segment 135 having three sections 200A, 200B, and 200C above is used for illustration. A segment 135 has any number of sections 200.

In some embodiments, in a read operation (e.g., memory 100 is in a read access), the transistors MR and MW of an accessed column of an accessed segment are turned on and off, respectively. As a result, the voltage level at the column internal ground node CIGD and the internal ground nodes Vgnd of all memory cells in the corresponding accessed column are electrically connected to voltage VSS. Similarly, transistors MR and MW in an un-accessed column of an accessed segment are also turned on and off, respectively, and, consequently, the voltage level at the column internal ground node CIGD and the internal ground nodes Vgnd of all memory cells in the corresponding un-accessed column are electrically connected to voltage VSS. At the same time, in an un-accessed segment, transistors MR and transistors MW are turned off and on, respectively so that the voltage level at nodes Vgnd is controlled by the voltage level of voltage Vwa. In such a situation, the voltage level of voltage Vwa is set considering the balance between avoiding the risk of corrupting the stored data by having voltage Vwa as low as possible (e.g., VSS) and the need to save power (e.g., raising voltage Vwa sufficient to retain the stored data). In some embodiments, an un-accessed column is considered as in the "dummy" read mode because the word line WL turning on the write accessed memory cells also turns on the memory cells on the same row with the accessed memory cells that are in the un-accessed columns, enabling the data stored in nodes NO and ZNO available for reading.

In some embodiments, in a write operation (e.g., memory 100 is in a write access), the transistors MR and MW in an accessed column of an accessed section are turned off and on, respectively. As a result, the column internal ground node CIGD and the corresponding internal ground nodes Vgnd of all memory cells in the corresponding accessed column are electrically coupled to voltage Vwa, which is generated based on a predetermined value that enables writing data to the accessed memory cell MC easier. For example, when the data is written to a memory cell MC in a column C[1], in some embodiments, transistor MR[1] is turned off, transistor MW[1] is turned on, and, as a result, the voltage level at node Vgnd[1] is at about the voltage level of voltage Vwa. In some embodiments, because voltage Vwa is set higher than VSS (or ground or 0 V), the voltage level at node Vgnd[1] is higher than VSS. At the same time, bit lines BL[1] and BLB[1] are pre-charged to a High (e.g., VDD) with respect to VSS. As a result, transistors P1 and P2 of the accessed memory cell are weaker than the corresponding transistors N1 and N2 making writing to the respective nodes NO and ZNO easier. Further, memory 100 is able to operate with a lower operation voltage VDD. In some embodiments, in an un-accessed column of an accessed segment, transistors MR and MW are on and off, respectively. Because the transistor MR is on, the column internal ground node CIGD and the corresponding internal ground nodes Vgnd are electrically coupled to VSS. Further, transistors MR and MW of all columns in an un-accessed segment are turned off and on, respectively so that the voltage level at the corresponding nodes Vgnd is controlled by the voltage level of voltage Vwa. In such a situation, the voltage level of voltage Vwa is set considering the balance between avoiding the risk of corrupting the stored data by having voltage Vwa as low as possible (e.g., VSS) and the need to save power by raising voltage Vwa sufficient to retain the stored data. In some embodiments, an un-accessed column is considered as in the "dummy" read mode because the word line WL turning on the write accessed memory cells also turns on the memory cells on the same row with the accessed memory cells that are in the un-accessed columns, enabling the stored data available for reading.

Voltage Vwa

Figure 3:
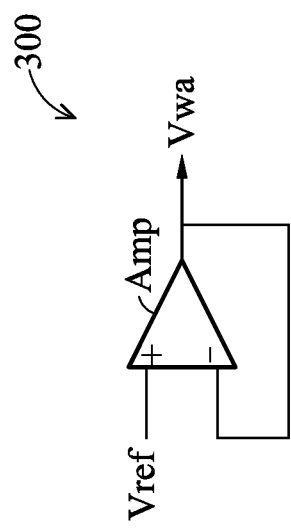
FIG. 3 is a diagram of a circuit illustrating how voltage Vwa is generated, in accordance with some embodiments.

FIG. 3 is a circuit diagram 300 illustrating how voltage Vwa is generated, in accordance with some embodiments. Reference voltage Vref is provided to the non-inverting (e.g., positive) input of amplifier Amp. Output voltage Vwa is feedback to the inverting (e.g., negative) input of amplifier Amp. Amplifier Amp is configured as a voltage follower. As a result, voltage Vwa follows reference voltage Vref.

In some embodiments, in a write operation, the ratio of the voltage at a bit line over voltage VDD is selected to be at least 10%. Without raising voltage Vwa, voltage VDD cannot be lowered too much for memory 100 to continue to function and maintain the ratio to be at least 10%. For example, voltage VDD cannot be lowered below 90% of its normal operation voltage. In some embodiments, however, raising voltage Vwa enables voltage VDD to be lowered to about 70% of its normal operation voltage, but the ratio is still maintained at least 10%. In some embodiments, voltage Vwa (or voltage Vref) is selected based on a predetermined value (e.g., 50 mV, 70 mV, 100 mV, etc.). In some further embodiments, voltage Vwa is set at a percentage of the normal operation voltage VDD (e.g., 5%, 7%, 10%, etc.).

Illustrative Method

Figure 4:
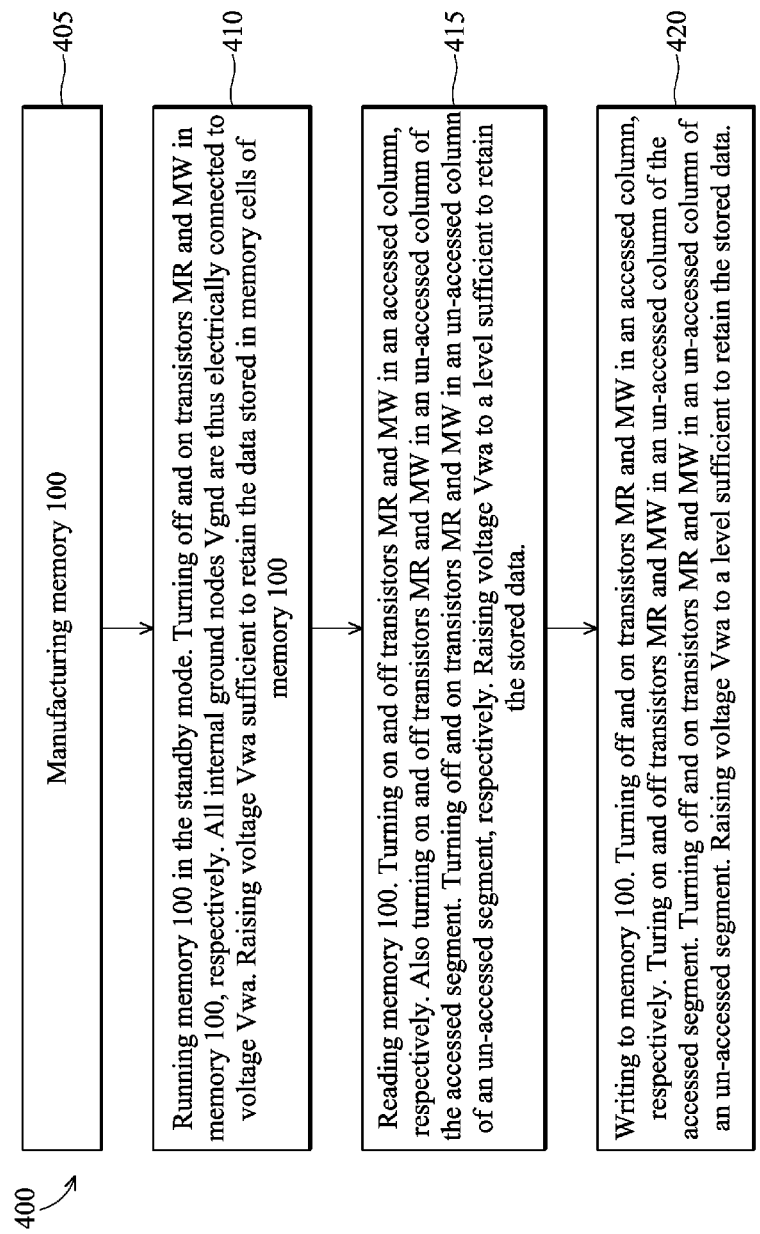
FIG. 4 is a flowchart illustrating a method for operating the memory in FIG. 1, in accordance with some embodiments.

FIG. 4 is a flowchart 400 illustrating a method for operating a memory 100, in accordance with some embodiments.

In step 405, memory 100 is manufactured having, for example, two memory arrays 130. Each memory array 130 has a plurality of segments 135. Each segment 135 has a three sections 200A, 200B, and 200C, and each section 200 has two rows RO1 and RO2 and four columns, i.e., column C[1], column C[2], column C[3], and column C[4]. Nodes VDD are coupled together. Nodes Vgnd in a column are coupled together (e.g., all nodes Vgnd[1] are coupled together; all nodes Vgnd[2] are coupled together, all nodes Vgnd[3] are coupled together, etc.). Nodes VSS are coupled together.

In step 410, memory 100 is configured to a standby mode (or a data retention mode) wherein all transistors MR and MW are turned off and on, respectively. As a result, all internal ground nodes Vgnd are electrically connected to voltage Vwa, and, to save power, voltage Vwa is raised to a level sufficient to retain the data stored in memory cells of memory 100.

In step 415, memory 100 is configured to a read mode. For illustration, the data is read from memory cells (the accessed memory cells AMC) in an arbitrary segment 135 (e.g., segment 135R, not labeled). Further, the accessed memory cells AMC are in row RO1 and in each column C[1] of each section 200A, 200B, and 200C of segment 135R. In this illustration, transistors MR and MW in the accessed columns C[1] are on and off, respectively. Transistors MR and MW in an un-accessed column of the accessed segment 135R (e.g., columns C[2], C[3], and C[4]) in the accessed segment 135 are also on and off, respectively. At the same time, transistors MR and MW of an un-accessed segment (e.g., columns C[1], C[2], C[3], and C[4] of a segment other than segment 135R) are off and on, respectively. Further, to save power in these columns, voltage Vwa is raised to a level sufficient to retain the stored data.

In step 420, memory 100 is configured to a write mode. For illustration, the data is written to memory cells (the accessed memory cells AMC) in an arbitrary segment 135 (e.g., segment 135W, not labeled). Further, the accessed memory cells AMC are in row RO1 and in each column C[1] of each section 200A, 200B, and 200C of segment 135W. In this illustration, transistors MR and MW in the accessed columns C[1] are off and on, respectively. Transistors MR and MW in an un-accessed column of the accessed segment 135W (e.g., columns C[2], C[3], and C[4]) are on and off, respectively. At the same time, transistors MR and MW of an un-accessed segment (e.g., columns C[1], C[2], C[3], and C[4] of a segment other than segment 135R) are off and on, respectively. Further, to save power in these columns, voltage Vwa is raised to a level sufficient to retain the stored data.

Ground Circuit—Some Further Embodiments

Figure 5:
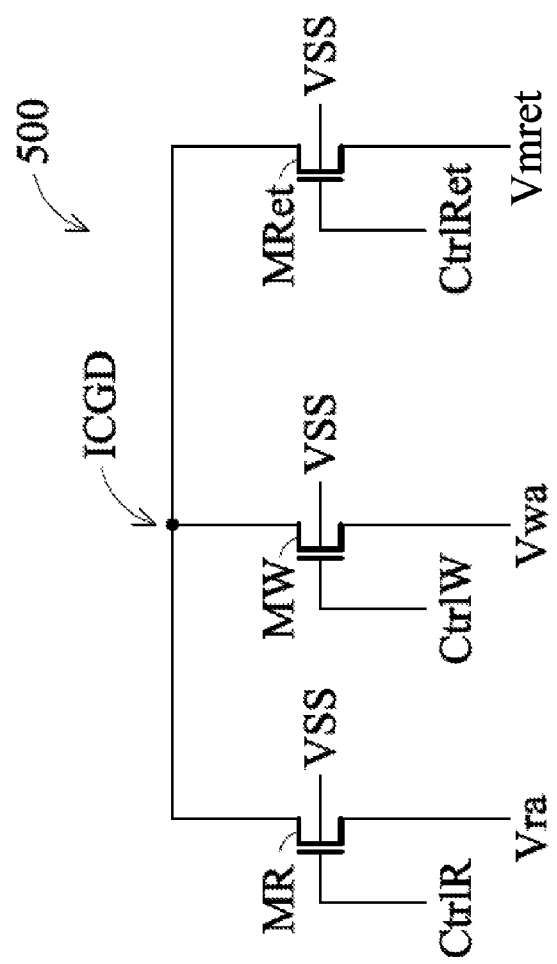
FIG. 5 is a diagram of a regulated ground circuit, in accordance with some further embodiments.

FIG. 5 is a detail diagram of a regulated ground circuit (e.g., circuit 500), in accordance with some further embodiments. Compared to a ground circuit 220 in FIG. 2, circuit 500 includes an additional transistor (e.g., a transistor Mret) connected in parallel with the corresponding transistors MR and MW. That is, the drain of transistor Mret is coupled to the corresponding column internal ground node CIGD, the gate of transistor Mret is controlled by a control voltage (e.g., voltage CtrlRet), and the source of transistor Mret is coupled to a voltage (e.g., voltage Vmret) to further regulate the voltage level at node CIGD. Further, a variable voltage (e.g., voltage Vra) replaces voltage VSS at the source of transistor MR to also further regulate the voltage level at column internal ground node CIGD. In some embodiments, similar to signals CtrlR and CtrlW controlling the respective transistors MR and MW, a signal CtrlRet controls all transistors MRet in a same column number of different sections 200 of a segment 135. For example, if a segment 135 has three sections 200 (e.g., sections 200A, 200B, and 200C), and each of sections 200A, 200B, and 200C has n columns C[1] to C[n], then a first voltage CtrlRet (e.g., voltage CtrlRet[1]) controls all transistors MRet in column C[1] of each section 200A, 200B, and 200C, a second voltage (e.g., voltage CtrlRet[2]) controls all transistors MRet in column C[2] of each section 200A, 200B, and 200C, a third voltage (e.g., voltage CtrlRet[3]) controls all transistor MRet in column C[3] of each section 200A, 200B, and 200C, etc.

In some embodiments, voltage Vra and/or voltage Vmret is generated in a similar manner like voltage Vwa is generated, e.g., by a circuit similar to circuit 300. In circuit 500, because column internal ground node CIGD is electrically connected to three different voltages Vra, Vwa, and Vmret, the voltage level of column internal ground node CIGD is controlled by one or a combination of voltages Vra, Vwa, and Vmret as appropriate. For example, voltage Vra is used to regulate column internal ground node CIGD in a read accessed column, voltage Vwa is used to regulate column internal ground node CIGD in a write accessed column, and voltage Vmret is used to regulate column internal ground node CIGD for cells in a retention mode (e.g., in un-accessed segments, etc.). For example, in a power retention mode in some embodiments, all column internal ground nodes CIGD are electrically coupled to voltage Vmret, and voltage Vmret is set at a data retention value. In some alternative embodiments, the column internal ground nodes CIGD are coupled to any one of voltages Vra, Vwa, or Vmret, and these voltages are set as appropriate (e.g., to voltage Vmret). In a read mode, the column internal ground node of an accessed column AC is coupled to voltage Vra. The column internal ground node CIGD of an un-accessed column UAC of the accessed segment (e.g., segment 135R) is coupled voltage Vra. The column internal ground node CIGD of an un-accessed segment (e.g., a segment other than segment 135R) is coupled to voltage Vmret. In a write mode, the column internal ground node of an accessed column AC is coupled to voltage Vwa. The column internal ground node CIGD of an un-accessed column UAC of the accessed segment (e.g., segment 135W) is coupled to voltage Vra. The column internal ground node CIGD of an un-accessed segment (e.g., a segment other than segment 135W) is coupled to voltage Vmret. The above examples are for illustration, embodiments of the disclosures are not so limited. Because voltages Vwa, Vra, and Vmret are variables, they are used/set as appropriate. For example, the cells or columns that are in a retention mode can also be electrically coupled to voltage Vwa or Vra, and voltage Vwa or Vra is set to a retention value (e.g., Vmret). In some embodiments, voltage VDD is about 0.85 V, voltage Vwa is about 10% of voltage VDD; voltage Vra is about 5% of voltage VDD, and voltage Vmret is about 0.45 V (about 53% of voltage VDD, because 0.45/0.85≈0.53). In some other embodiments, voltage VDD is about 1.0 V to 2.5 V, but the disclosed embodiments are not so limited, and are applicable with other values of voltage VDD, Vwa, Vra, and Vmret.

A number of embodiments have been described. It will nevertheless be understood that various modifications can be made without departing from the spirit and scope of the disclosure. For example, the various transistors being shown as a particular dopant type (e.g., NMOS and PMOS) are for illustration, embodiments of the disclosure are not limited to a particular type, but the dopant type selected for a particular transistor is a design choice and is within the scope of the embodiments. The logic level (e.g., low or high) of the various signals used in the above description is also for illustration purposes, the embodiments are not limited to a particular level when a signal is activated and/or deactivated, but, rather, selecting such a level is a matter of design choice. In various situations, a transistor (e.g., transistor MR or MW) functions as a switch. As a result, a switch can be used in place of a transistor that functions as a switch. The illustrative method shows exemplary steps, but they are not necessarily performed in the order shown. Steps may be added, replaced, changed order, and/or eliminated as appropriate, in accordance with the spirit and scope of disclosed embodiments.

In accordance with an embodiment, a method of writing data to an accessed memory cell of an accessed column of an accessed section of an accessed segment of a memory array of memory cells includes electrically coupling a first voltage source of the at least three voltage sources to a column internal ground node of an accessed column; and electrically coupling the first voltage source of the at least three voltage sources to a column internal ground node of an un-accessed column of an un-accessed segment. The memory array of memory cells having at least one segment; each memory cell having an internal ground node; the at least one segment having at least one section; each section having at least one column and at least one row; each column having at least three switches and a column internal ground node capable of being electrically coupled to at least three voltage sources through a corresponding one of the at least three switches; the column internal ground node of each column being coupled to a corresponding internal ground node of memory cells in the at least one column.

In accordance with another embodiment, a method of writing data to a memory array of memory cells includes turning on corresponding first switches of an accessed column of the memory array and turning off corresponding second and third switches of the accessed column of the memory array; and turning on corresponding first switches of an un-accessed column of an un-accessed segment of the memory and turning off corresponding second and third switches of the un-accessed column of the un-accessed segment of the memory array. The memory array comprising a plurality of segments, each segment of the plurality of segments comprising a plurality of columns of memory cells, each column of the plurality of columns of memory cells comprising a column internal ground node, a first switch between the column internal ground node and a first voltage node, a second switch between the column internal ground node and a second voltage node, and a third switch between the column internal ground node and a third voltage node.

In accordance with another embodiment, a method of writing data to a memory array of memory cells includes electrically coupling the first voltage node to corresponding column internal ground nodes of an accessed column of the memory array via corresponding first switches; and electrically coupling the first voltage node to corresponding column internal ground nodes of an un-accessed column of an un-accessed segment of the memory array via corresponding first switches. The memory array comprising a plurality of segments, each segment of the plurality of segments comprising a plurality of columns of memory cells, each column of the plurality of columns of memory cells comprising a column internal ground node, a first switch between the column internal ground node and a first voltage node, a second switch between the column internal ground node and a second voltage node, and a third switch between the column internal ground node and a third voltage node.

Each claim of this document constitutes a separate embodiment, and embodiments that combine different claims and/or different embodiments are within scope of the disclosure and will be apparent to those of ordinary skill in the art after reviewing this disclosure.

What is claimed is:

1. A method of writing data to an accessed memory cell of an accessed column of an accessed section of an accessed segment of a memory array of memory cells; the memory array of memory cells having at least one segment; each memory cell having an internal ground node; the at least one segment having at least one section; each section having at least one column and at least one row; each column having at least three switches and a column internal ground node capable of being electrically coupled to at least three voltage sources through a corresponding one of the at least three switches; the column internal ground node of each column being coupled to a corresponding internal ground node of memory cells in the at least one column, the method comprising:
　　electrically coupling a first voltage source of the at least three voltage sources to a column internal ground node of an accessed column; and
　　electrically coupling the first voltage source of the at least three voltage sources to a column internal ground node of an un-accessed column of an un-accessed segment.

2. The method of claim 1, further comprising electrically coupling a second voltage source of the at least three voltage sources to a column internal ground node of an un-accessed column of an accessed segment, the first voltage source having a first voltage level different from a second voltage level of the second voltage source.

3. The method of claim 2, further comprising using:
  a first switch of the at least three switches of the accessed column configured to electrically couple the first voltage source to the column internal ground node of the accessed column;
  a second switch of the at least three switches of the un-accessed column of the un-accessed segment configured to electrically couple the second voltage source to the column internal ground node of the un-accessed column of the un-accessed segment; and
  a third switch of the at least three switches of the un-accessed column of an accessed segment configured to electrically couple a third voltage source to the column internal ground node of the un-accessed column of an accessed segment.

4. The method of claim 2, further comprising using ground of the memory array as the second voltage source and using a voltage source having a voltage higher than ground as the first voltage source.

5. The method of claim 2, further comprising:
  setting the first voltage source to have the first voltage level sufficient for performing a write operation on a memory cell of the memory array having the corresponding column internal ground node coupled to the first voltage source; and
  setting the second voltage source to have the second voltage level sufficient for performing a read operation on another memory cell of the memory array having the corresponding column internal ground node coupled to the second voltage source.

6. The method of claim 2, further comprising setting a third voltage source of the at least three voltage sources at a voltage level sufficient to retain data in a memory cell having the corresponding column internal ground node coupled to the third voltage source.

7. The method of claim 1, further comprising using a first switch of the at least three switches of the accessed column configured to electrically couple the first voltage source to the column internal ground node of the accessed column.

8. The method of claim 7, further comprising using a second switch of the at least three switches of an un-accessed column of an un-accessed segment configured to electrically couple the second voltage source to the column internal ground node of the un-accessed column of the un-accessed segment.

9. The method of claim 8, further comprising using an NMOS transistor as the first switch or the second switch.

10. A method of writing data to a memory array of memory cells, the memory array comprising a plurality of segments, each segment of the plurality of segments comprising a plurality of columns of memory cells, each column of the plurality of columns of memory cells comprising a column internal ground node, a first switch between the column internal ground node and a first voltage node, a second switch between the column internal ground node and a second voltage node, and a third switch between the column internal ground node and a third voltage node, and the method comprising:
  turning on corresponding first switches of an accessed column of the memory array and turning off corresponding second and third switches of the accessed column of the memory array; and
  turning on corresponding first switches of an un-accessed column of an un-accessed segment of the memory array and turning off corresponding second and third switches of the un-accessed column of the un-accessed segment of the memory array.

11. The method of claim 10, further comprising:
  setting the first voltage node to have a first voltage level sufficient for performing a write operation on a memory cell of the memory array having the corresponding column internal ground node coupled to the first voltage node;
  setting the second voltage node to have a second voltage level sufficient for performing a read operation on another memory cell of the memory array having the corresponding column internal ground node coupled to the second voltage node; and
  setting the third voltage node to have a third voltage level sufficient for retaining data on yet another memory cell of the memory array having the corresponding column internal ground node coupled to the third voltage node.

12. The method of claim 11, further comprising generating a first voltage at the first voltage node having a first voltage level, and the first voltage level is equal to or less than about 10% of a first supply voltage level of a first voltage supply.

13. The method of claim 12, further comprising generating a second voltage at the second voltage node having the second voltage level, and the second voltage level is equal to or less than about 5% of the first supply voltage level of the first voltage supply.

14. The method of claim 13, further comprising generating a third voltage at the third voltage node having the third voltage level, and the third voltage level is equal to or less than about 53% of the first supply voltage level of the first voltage supply.

15. The method of claim 11, further comprising turning on corresponding second switches of an un-accessed column of an accessed segment of the memory and turning off corresponding first and third switches of the un-accessed column of the un-accessed segment of the memory array.

16. A method of writing data to a memory array of memory cells, the memory array comprising a plurality of segments, each segment of the plurality of segments comprising a plurality of columns of memory cells, each column of the plurality of columns of memory cells comprising a column internal ground node, a first switch between the column internal ground node and a first voltage node, a second switch between the column internal ground node and a second voltage node, and a third switch between the column internal ground node and a third voltage node, and the method comprising:
  electrically coupling the first voltage node to corresponding column internal ground nodes of an accessed column of the memory array via corresponding first switches; and
  electrically coupling the first voltage node to corresponding column internal ground nodes of an un-accessed column of an un-accessed segment of the memory array via corresponding first switches.

17. The method of claim 16, further comprising electrically coupling the second voltage node to corresponding column internal ground nodes of an un-accessed column of an accessed segment of the memory array via corresponding second switches.

18. The method of claim 16, further comprising:
  setting the first voltage node to have a first voltage level sufficient for performing a write operation on a memory cell of the memory array having the corresponding column internal ground node coupled to the first voltage node;

setting the second voltage node to have a second voltage level sufficient for performing a read operation on another memory cell of the memory array having the corresponding column internal ground node coupled to the second voltage node; and setting the third voltage node to have a third voltage level sufficient for retaining data on yet another memory cell of the memory array having the corresponding column internal ground node coupled to the third voltage node.

19. The method of claim 18, wherein the first voltage level is equal to or less than about 10% of a first supply voltage level of a first voltage supply;

the second voltage level is equal to or less than about 5% of the first supply voltage level of the first voltage supply; and the third voltage level is equal to or less than about 53 of the first supply voltage level of the first voltage supply.

20. The method of claim 16, further comprising using an NMOS transistor as the first switch, the second switch or the third switch.

* * * * *